(12) United States Patent
Sogabe et al.

(10) Patent No.: US 6,891,906 B1
(45) Date of Patent: May 10, 2005

(54) DEMODULATOR, CLOCK RECOVERY CIRCUIT, DEMODULATION METHOD AND CLOCK RECOVERY METHOD

(75) Inventors: Yasushi Sogabe, Tokyo (JP); Fumio Ishizu, Tokyo (JP); Keishi Murakami, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/150,011

(22) Filed: Sep. 9, 1998

(30) Foreign Application Priority Data

Sep. 12, 1997 (JP) .............................................. 9-248349

(51) Int. Cl.[7] .............................................. H03D 1/00
(52) U.S. Cl. ........................ 375/343; 375/324; 375/355
(58) Field of Search ................................ 375/343, 355, 375/361, 316, 324, 326, 150

(56) References Cited

U.S. PATENT DOCUMENTS

| | | | | |
|---|---|---|---|---|
| 4,833,694 A | * | 5/1989 | Young et al. ................ | 375/285 |
| 5,117,441 A | * | 5/1992 | Weigand ..................... | 375/90 |
| 5,235,622 A | * | 8/1993 | Yoshida ...................... | 375/106 |
| 5,285,482 A | | 2/1994 | Sehier et al. | |
| 5,396,515 A | * | 3/1995 | Dixon et al. ................ | 375/208 |
| 5,488,629 A | * | 1/1996 | Takahashi et al. .......... | 375/306 |
| 5,499,273 A | * | 3/1996 | Kull et al. ................... | 375/355 |
| 5,602,879 A | * | 2/1997 | Wada .......................... | 375/355 |
| 5,696,800 A | * | 12/1997 | Berger ......................... | 375/361 |
| 5,757,857 A | * | 5/1998 | Buchwald .................... | 375/271 |
| 5,905,949 A | * | 5/1999 | Hawkes ....................... | 455/410 |
| 5,907,587 A | * | 5/1999 | Sokoler ....................... | 375/368 |
| 5,999,561 A | * | 12/1999 | Naden et al. ................ | 375/206 |

FOREIGN PATENT DOCUMENTS

| | | |
|---|---|---|
| DE | 3844767 C2 | 2/1989 |
| DE | 3732287 A1 | 4/1989 |
| DE | 3888927 T2 | 5/1989 |
| DE | 4225426 A1 | 2/1993 |
| EP | 03660826 A2 | 5/1990 |
| JP | 63-313945 | 12/1988 |
| JP | A4- 230137 | 8/1992 |
| JP | 2508502 B2 | 4/1996 |

* cited by examiner

*Primary Examiner*—Temesghen Ghebretinsae
(74) *Attorney, Agent, or Firm*—Birch, Stewart, Kolasch & Birch, LLP (57) ABSTRACT

A demodulator is constituted by: a clock recovery circuit for generating a recovered clock from the series of received data and outputting the recovered clock; a state estimation circuit for making an estimation about a reception state such as waveform distortion or the like from the series of received data, and outputting waveform information based on the result of the estimation; and a correlator for correcting a reference and/or sample points on the basis of the recovered clock and the waveform information, obtaining a correlation value between the series of received data and the reference from a plurality of the sample points, and outputting demodulated data on the basis of the correlation value.

21 Claims, 7 Drawing Sheets

DEMODULATOR, CLOCK RECOVERY CIRCUIT, DEMODULATION METHOD AND CLOCK RECOVERY METHOD

BACKGROUND OF THE INVENTION

1. Field of the Invention

The present invention relates to a demodulation technique in communication using a coding method in which each symbol is expressed by a plurality of bits on a time base.

2. Description of the Related Art

Figure 10:
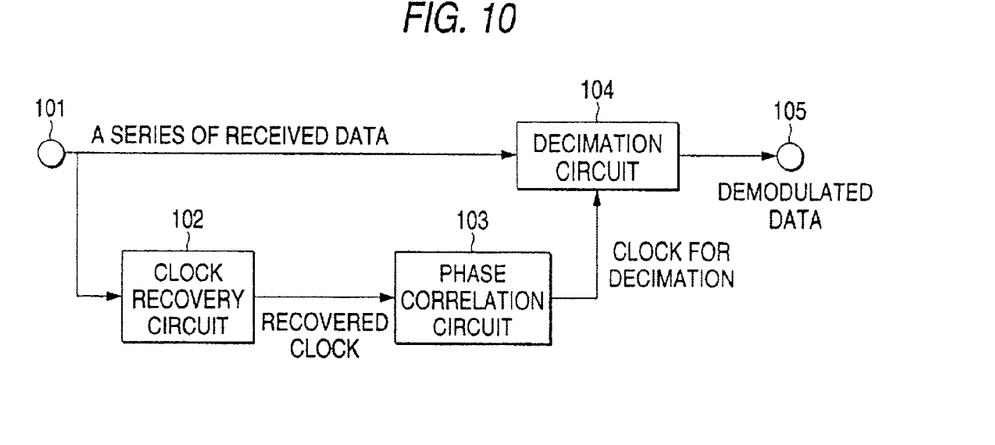
Figure 11:
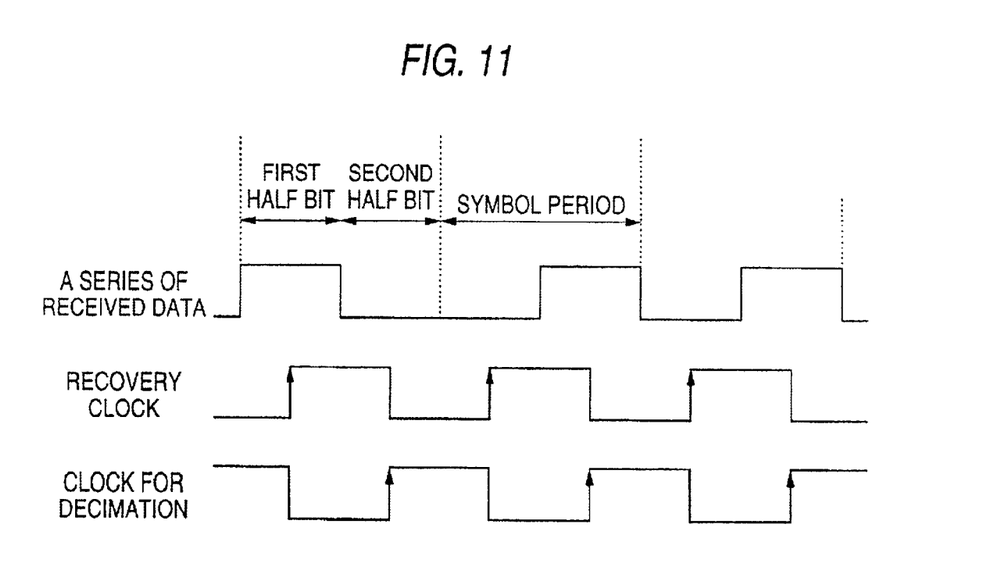
Figure 12:
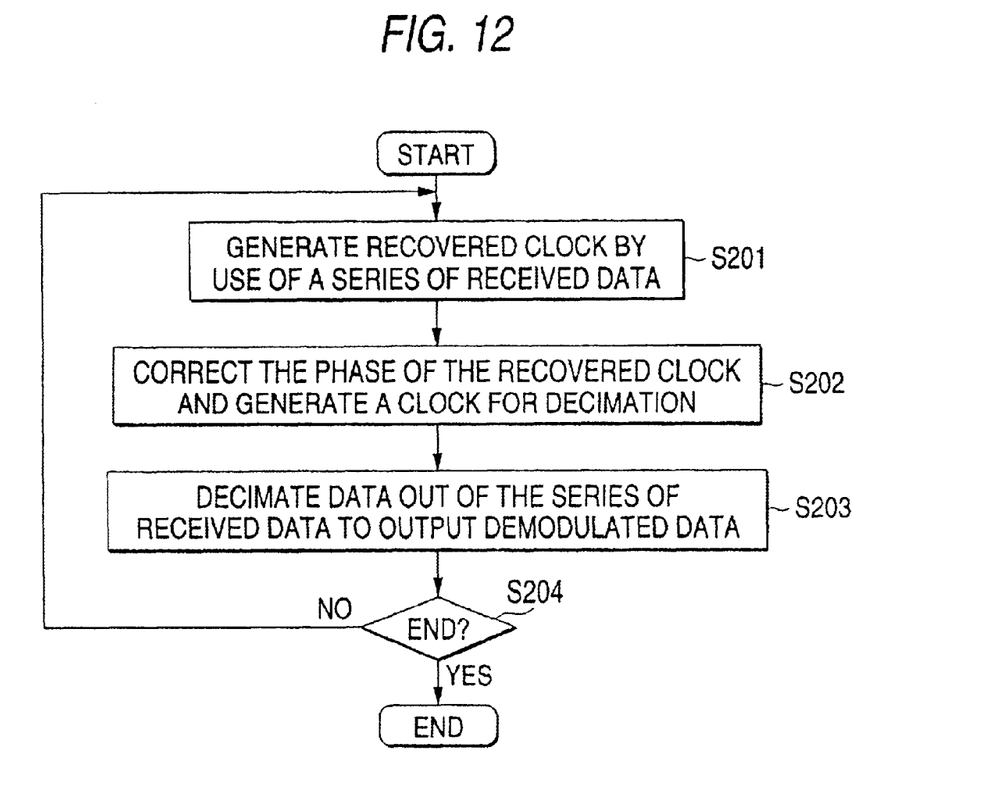

For example, a system in which a recovered clock is generated by use of a series of received data, and demodulated data is decimated from the series of received data by use of the recovered clock is proposed as a demodulator for generating demodulated data from Manchester-coded signals. FIG. 10 is a block diagram of an configuration example of a conventional demodulator, schematically showing a configuration of a demodulation circuit, for example, disclosed in Japanese Patent No. 2508502, entitled "Demodulation Circuit" (by Norio Numata, Takayuki Inoue, and Kenichi Sugawara). Further, FIG. 11 is a schematic diagram for explaining the operation of the conventional demodulator, and FIG. 12 is a flow chart showing the operation of the conventional demodulator.

In FIG. 10, the reference numeral 101 represents an input terminal into which a series of Manchester-coded received data are inputted; 102, a clock recovery circuit for generating a recovered clock by use of the series of received data, and outputting the recovered clock; 103, a phase correction circuit for correcting the phase of the recovered clock supplied from the clock recovery circuit 102 in order to generate a clock for decimation in demodulation, and outputting the corrected recovered clock as the clock for decimation; 104, a decimation circuit for decimation demodulated data out of the series of received data by use of the clock for decimation supplied from the phase correction circuit 103, and outputting the decimated demodulated data; and 105, an output terminal for the demodulated data.

Next, the operation will be described with reference to FIGS. 10 to 12. The series of Manchester-coded received data has an inversion of data in each symbol, and each symbol is formed of two bits. For example, when "1" is transmitted by an NRZ (Non Return to Zero) signal, the "1" is expressed by "10" in Manchester code, while when "0" is transmitted, the "0" is expressed by "01". Therefore, in demodulation, Manchester decoding is also performed at the same time by thinning out the bit in the first half or the bit in the second half in each symbol.

First, when a series of received data are inputted to the input terminal 101, the operation starts. When a recovered clock is generated by use of the series of received data in the clock recovery circuit 102 (Step S201), the phase correction circuit 103 corrects the phase of the recovered clock outputted from the clock recovery circuit 102 so as to make the phase correspond to the bit in the first half or the bit in the second half in each symbol, and supplies the corrected recovered clock as a clock for decimation to the decimation circuit 104 in the succeeding stage (Step S202). The decimation circuit 104 decimates data from the series of received data by use of the clock for decimation supplied from the phase correction circuit 103 in the preceding stage, and outputs the data as demodulated data (Step S203). If the input of the series of received data disappears and the demodulation is completed, the operation is ended.

As described above, a conventional demodulator corrects the phase of a recovered clock generated by use of a series of received data so as to make the phase correspond to the bit in the first half or the bit in the second half in each symbol to thereby generate a clock for decimation, and demodulated data out of the series of received data by use of the clock for decimation to thereby perform demodulation.

However, in the conventional system, there has been a problem that a data decision point is apt to be mistaken by noise or interference because demodulation is performed by one-point data per symbol. Further, though it is intended to reduce the error rate by thinning out the bits in the second half in each symbol, there has been a problem that an error occurs easily when there is a distortion in a transmission waveform, or when the duty ratio of "H" and "L" in a symbol is deteriorated (for example, it is 4:6) because of a detector characteristic or a transmission path characteristic.

SUMMARY OF THE INVENTION

The present invention is intended to solve the foregoing problems, and it is an object of the present invention to perform demodulation at a low bit error rate in spite of presence of noise or interference. It is another object of the present invention to perform demodulation at a low bit error rate even when a reception waveform is distorted by intersymbol interference or detector characteristic, or when the duty ratio is deteriorated.

According to an aspect of the present invention, there is provided a demodulator for generating demodulated data from a series of received data which is coded so that each symbol is expressed by a plurality of bits on a time base, characterized by comprising: a clock recovery circuit for generating a recovered clock from the series of received data and outputting the recovered clock; a state estimation circuit for making an estimation about a reception state such as waveform distortion or the like from the series of received data, and outputting waveform information based on the result of the estimation; and a correlator for correcting a reference and/or sample points on the basis of the recovered clock and the waveform information, obtaining a correlation value between the series of received data and the reference from a plurality of the sample points, and outputting demodulated data on the basis of the correlation value.

According to another aspect of the present invention, there is provided a demodulator for generating demodulated data from a series of received data which is coded so that each symbol is expressed by a plurality of bits on a time base, characterized by comprising: a correlator for changing the phase of the series of received data or a reference gradually to thereby obtain correlations between the series of received data and the reference, and outputting a plurality of correlation values; a timing estimation circuit for obtaining a phase to be used for decision of the data on the basis of the plurality of correlation values, and outputting the phase as phase information; and a decimation circuit for decimating data from the series of received data on the basis of the phase information, and outputting the decimated data as demodulated data.

According to a further aspect of the present invention, in the above-mentioned demodulator, the correlator obtains correlations between the series of received data and a plurality of references the initial phases of which are different from one another, and outputs a plurality of correlation values corresponding to the plurality of references.

According to a still further aspect of the present invention, in the above-mentioned demodulator, the correlator obtains correlations between a reference having a predetermined phase and the series of received data the phase of which is changed gradually, and outputs a plurality of correlation values in accordance with the change of the phase of the series of received data.

According to another aspect of the present invention, in the above-mentioned demodulator, the demodulator further comprises a state estimation circuit for making an estimation about a reception state such as waveform distortion or the like from the series of received data, and outputting waveform information based on the result of the estimation, and the correlator corrects the reference and/or sample points on the basis of the waveform information.

According to a further aspect of the present invention, provided is a clock recovery circuit for recovering a clock from a series of received data which is coded so that each symbol is expressed by a plurality of bits on a time base, characterized by comprising a correlator for changing the phase of the series of received data or a reference gradually to thereby obtain a correlations between the series of received data and the reference, and outputting a plurality of correlation values, whereby a recovered clock is obtained on the basis of the plurality of correlation values.

According to a still further aspect of the present invention, in the above-mentioned clock recovery circuit, the correlator obtains correlations between the series of received data and a plurality of references the initial phases of which are different from one another, and outputs a plurality of correlation values corresponding to the plurality of references.

According to another aspect of the present invention, in the above-mentioned clock recovery circuit, the correlator obtains correlations between a reference having a predetermined phase and the series of received data the phase of which is changed gradually, and outputs a plurality of correlation values in accordance with the change of the phase of the series of received data.

According to a further aspect of the present invention, provided is a demodulation method for generating demodulated data from a series of received data which is coded so that each symbol is expressed by a plurality of bits on a time base, characterized by comprising: a clock recovery step of generating a recovered clock from the series of received data and outputting the recovered clock; a state estimation step of making an estimation about a reception state such as waveform distortion from the series of received data, and outputting waveform information based on the result of the estimation; and a correlation step of correcting a reference and/or sample points on the basis of the recovered clock and the waveform information, obtaining a correlation value between the series of received data and the reference from a plurality of the sample points, and outputting demodulated data on the basis of the correlation value.

According to a still further aspect of the present invention, provided is a modulation method for generating demodulated data from a series of received data which is coded so that each symbol is expressed by a plurality of bits on a time base, characterized by comprising: a correlation step of changing the phase of the series of received data or a reference gradually to obtain correlations between the series of received data and the reference, and outputting a plurality of correlation values; a timing estimation step of obtaining a phase to be used for data decision on the basis of the plurality of correlation values, and outputting the phase as phase information; and a decimation step of decimating data from the series of received data on the basis of the phase information, and outputting the decimated data as demodulated data.

According to another aspect of the present invention, in the above-mentioned demodulation method, the method further comprises a state estimation step of making an estimation about a reception state such as waveform distortion or the like from the series of received data, and outputting waveform information based on the result of the estimation, and the correlation step corrects the reference on the basis of the waveform information.

According to a further aspect of the present invention, provided is a clock recovery method for recovering a clock from a series of received data which is coded so that each symbol is expressed by a plurality of bits on a time base, characterized by comprising a correlation step of changing the phase of the series of received data or a reference gradually to obtain correlations between the series of received data and the reference to thereby output a plurality of correlation values, whereby a recovered clock is obtained on the basis of the plurality of correlation values.

DETAILED DESCRIPTION OF THE PREFERRED EMBODIMENTS

Now, a description will be given of preferred embodiments of the present invention with reference to the accompanying drawings.

Embodiment 1

Figure 1:
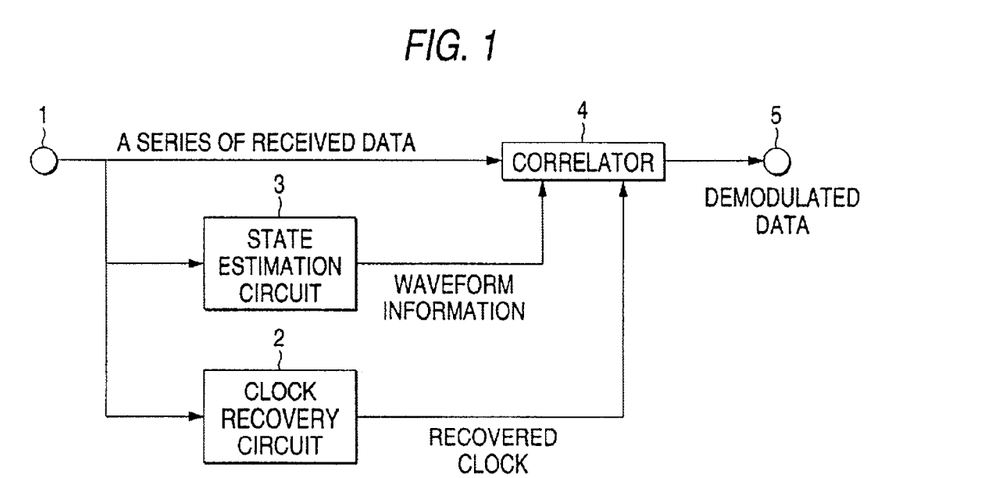
Figure 2A:
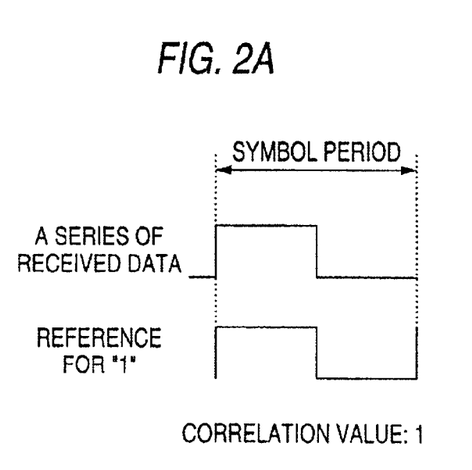
Figure 2B:
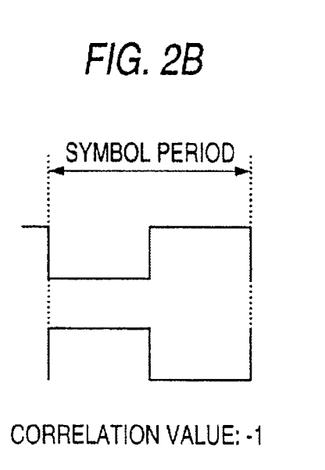
Figure 3:
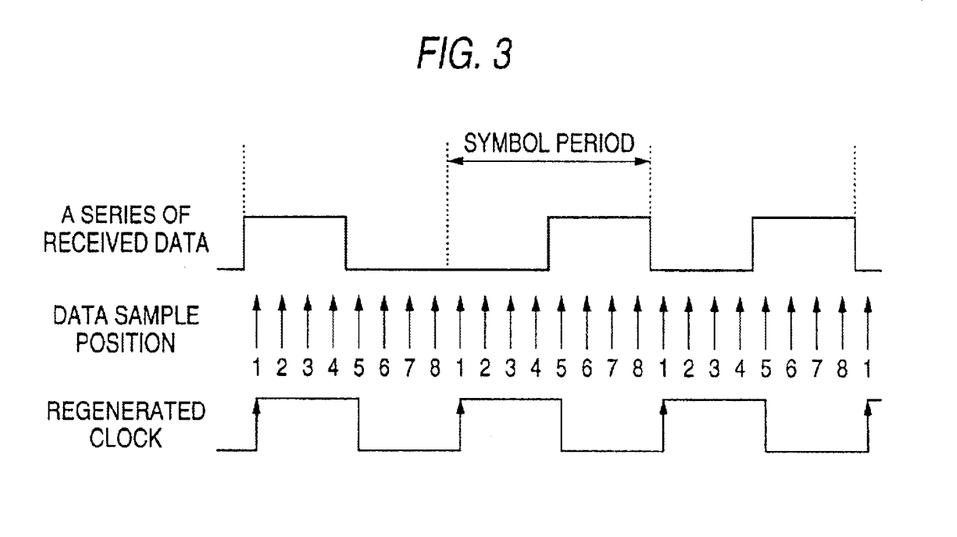
Figure 4:
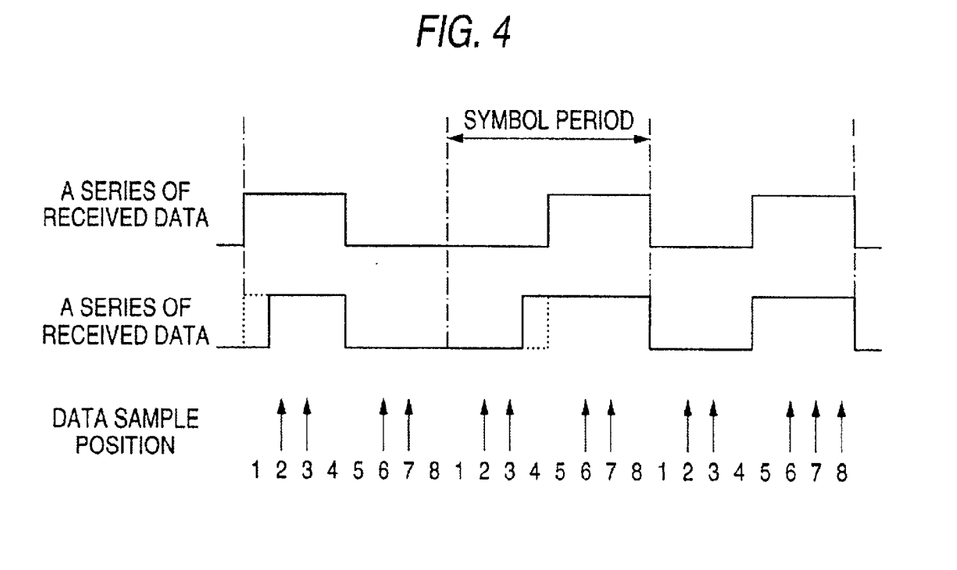
Figure 5:
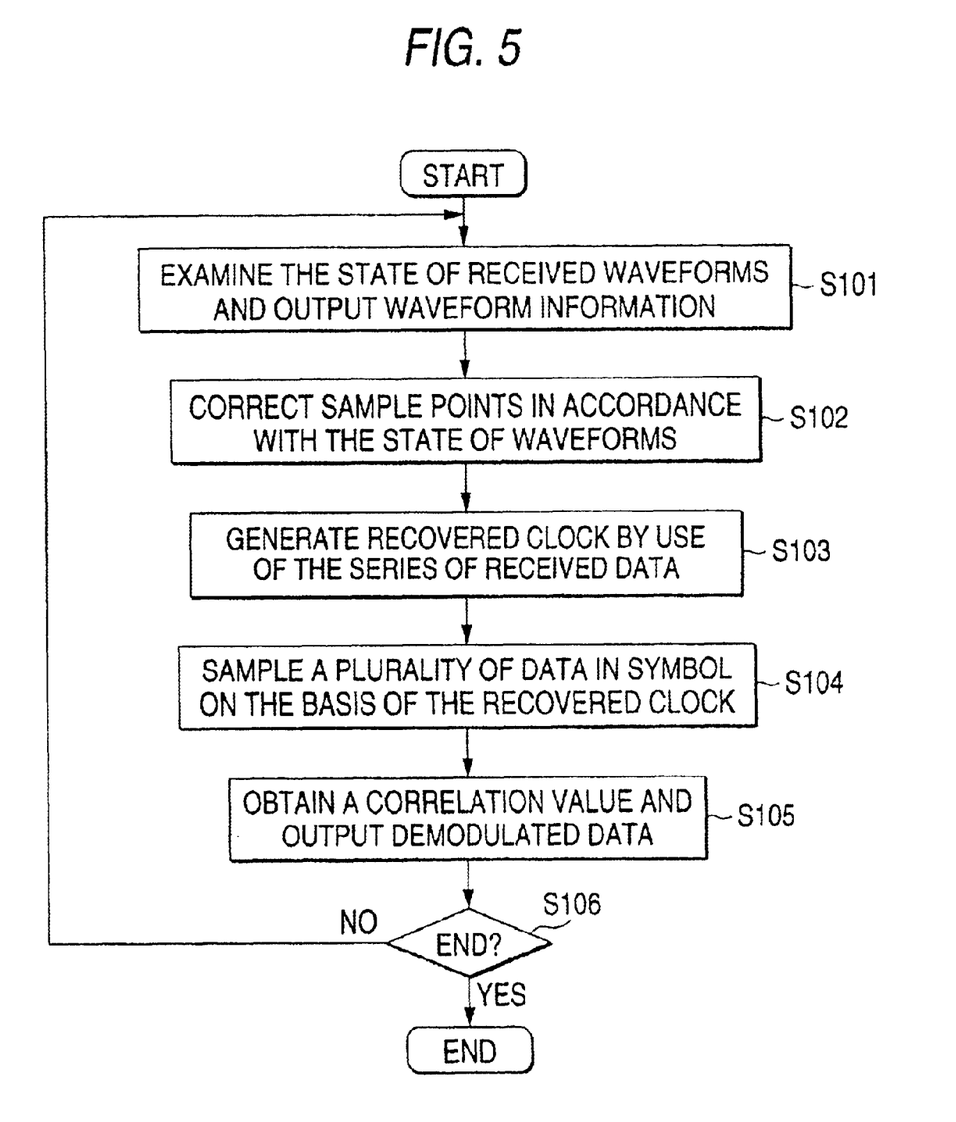

FIG. 1 is a block diagram showing a configuration of a demodulator in Embodiment 1 according to the present invention. FIGS. 2A, 2B and 3 are schematic diagrams for explaining the operation of a correlator. FIG. 4 is a schematic diagram for explaining the operation principle of the demodulator shown in FIG. 1. FIG. 5 is a flow chart showing the operation of the demodulator shown in FIG. 1.

In FIG. 1, reference numeral 1 represents an input terminal into which a series of Manchester-coded received data are inputted; 2, a clock recovery circuit for generating a recovered clock by use of the series of received data, and outputting the recovered clock; 3, a state estimation circuit for making an estimation about a reception state such as waveform distortion or the like from the series of received data, and outputting waveform information based on the result of the estimation; 4, a correlator for correcting a reference and/or sample point by use of the waveform information outputted from the state estimation circuit 3 and the recovered clock outputted from the clock recovery circuit 2, obtaining a correlation value between the series of received data and the reference on the basis of a plurality of the sample points per symbol, and outputting demodulated data on the basis of the correlation value; and 5, an output terminal for the demodulated data.

First, the basic operation of a correlator used for demodulation of a series of Manchester-coded received data will be described with reference to FIGS. 2A and 2B. As mentioned above, for example, when "1" is transmitted with an NRZ (Non Return to Zero) signal, it is expressed by "10" in Manchester code. When "0" is transmitted, it is expressed by "01".

On the other hand, either a reference for "0" having an ideal signal form when "0" is received, or a reference for 11' having an ideal signal form when "1" is received is provided in the correlator to thereby output modulated data on the basis of a correlation value between the series of received data and the reference.

Here, assume that the reference for "1" is used. Further, assume that the correlation value is set to "correlation value: 1" when the series of received data and the reference coincide with each other, and to "correlation value: −1" when the series of received data and the reference are inverted to each other.

For example, when a series of received data in a symbol takes a form shown in FIG. 2A, the correlator concludes that "1" has been received as an NRZ signal since the series of received data coincides with the reference so that "correlation value: 1" is obtained and then outputs modulated data "1". On the other hand, in the case of FIG. 2B, the correlator concludes that "0" has been received as an NRZ signal since the series of received data is inverted to the reference so that "correlation value: −1" is obtained and then outputs modulated data "0".

Next, the operation of the correlator 4 shown in FIG. 1 will be described by use of FIG. 3. Here, assume that the reference for "1" is used. Assume that the number of samples per symbol is 8 and the correlation value is within a range of −1 to 1 in order to simplify the description, though the number of samples and the range of the correlation value may be set desirably (increased or reduced) in accordance with the system. Further, assume that the first sample point in each symbol is synchronized with the recovered clock so as to be the first sample point of the symbol as shown in FIG. 3.

The correlator 4 looks over a correlation between the series of received data and the reference about 8 sample points per symbol to thereby obtain a correlation value. On the basis of the obtained result, the correlator 4 outputs demodulated data. For example, when a correlation between the series of received data and the reference is looked over, with the result that half or more of the sample points coincide, demodulated data is outputted. In any other case, on the contrary, demodulated data "0" is outputted.

Specifically, two sample points are inverted when 6 sample points coincide in the case where the correlator 4 looks over a correlation about 8 sample points. Therefore, the correlation value is $4/8(6/8+(-2/8)=4/8)$, and hence the demodulated data "1" is outputted. When 7 sample points are inverted, one sample point coincides. Therefore, the correlation value is $-6/8((-7/8)+1/8=(-6/8))$, and hence the demodulated data "0" is outputted.

Next, the operation principle of the demodulator will be described with reference to FIGS. 1 to 5. Although the number of samples per symbol is made to be 8 in order to simplify the description, the number of samples may be set desirably (increased or reduced) in accordance with the system.

When a series of input data are inputted to the input terminal 1, the operation starts. First, the waveform of the series of received data is examined in the state estimation circuit 3. For example, when the channel state is so bad that the waveform is distorted, sometimes, there is a case where sign-change points have jitters as shown in FIG. 4, and the data of sample points 1, 4, 5 and 8 are reverse data. In such a case, the data of these sample points are not used for taking a correlation with the reference, and only the data of sample points 2, 3, 6 and 7 are used.

Therefore, when it is formed that jitters in change points of the waveform are large as a result of examination, the state estimation circuit 3 supplies the correlator 4 with waveform information to tell that the data of the sample numbers 1, 4, 5 and 8 are not used for taking a correlation (Step S101). Responding to this, the correlator 4 corrects the sample points on the basis of the waveform information supplied from the state estimation circuit 3 (Step S102).

On the other hand, the clock recovery circuit 2 generates a recovered clock by use of the series of Manchester-coded received data (Step S103). The correlator 4 samples a plurality of points in each symbol by use of the recovered clock outputted from the clock recovery circuit 2 (Step S104); obtains a correlation value between the series of received data and the reference, and outputs demodulated data (Step S105). If the input of the series of received data disappears and the demodulation is completed, the operation is ended.

As described above, in the demodulator in this Embodiment 1, a reception state such as waveform distortion or the like is estimated by use of the waveform of the series of received data. While sample points are corrected on the basis of the state, a correlation value between the series of received data and the reference is obtained from a plurality of sample points per symbol, and demodulation is performed on the basis of the correlation value. In such a manner, it is possible to perform demodulation at a lower bit error rate when there is noise or interference, when the received waveform is distorted by intersymbol interference or by detector characteristic, or when the duty ratio is deteriorated.

Although in the Embodiment 1, description has been made about the case where sample points are corrected in accordance with the reception state when the channel state is so bad that the waveform is distorted, the form of the reference of the correlator may be corrected and used on the basis of the waveform information when fixed distortion of the waveform can be estimated by the state estimation circuit.

For example, when the duty ratio between "H" and "L" is not 50% because of the characteristic of the detector, the duty ratio is obtained in the state estimation circuit, and waveform information is supplied to the correlator. In the correlator, the reference is corrected on the basis of the waveform information. Further, sample data used for correlation is left as it is, and the reference is weighted.

Although in the Embodiment 1 description has been made about the demodulator for a series of Manchester-coded received data, the invention is applicable to any coding so long as each symbol is expressed by a plurality of bits on a time base. For example, the invention is easily applicable to a demodulator for a series of received data coded by FM (Frequency Modulation) coding, MFM (Modified FM) coding, or the like.

For example, a series of FM-coded received data become "11" or "100" when "0" is transmitted as an NRZ signal, while when "1" is transmitted, the data become "10" or "01". Therefore, in the correlator, a reference of "11" or "00" is prepared as the reference for "0", or a reference of "10" or "01" is prepared as the reference for "1".

For example, when the reference for "0" is prepared, a reference of "11" or "00" is prepared. For demodulation, a correlation is taken between the series of received data and the reference, and a correlation value is obtained. Further, the absolute value of the obtained correlation value is obtained. When the absolute value is close to "1", "1" is outputted as demodulated data, while when the absolute value is close to "0", "0" is outputted as demodulated data. In such a manner, modulation can be performed easily by changing the form of the prepared reference in accordance with coding.

Embodiment 2

Figure 6:
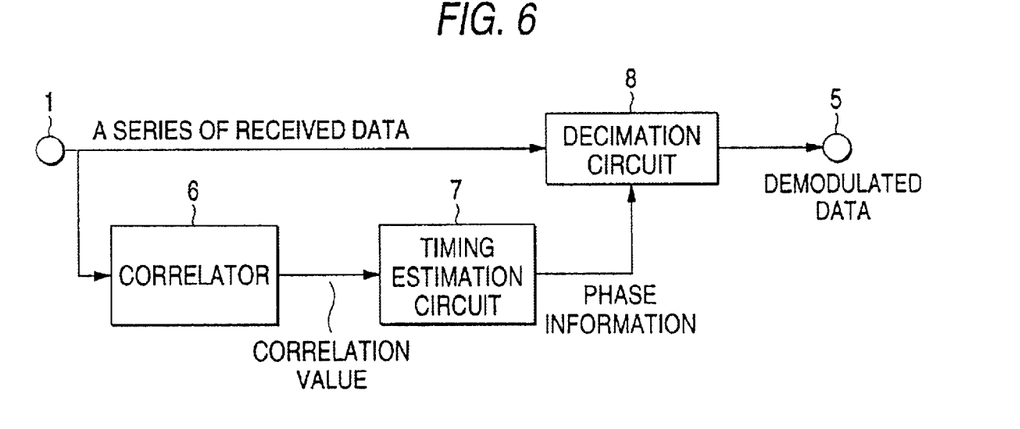
Figure 7:
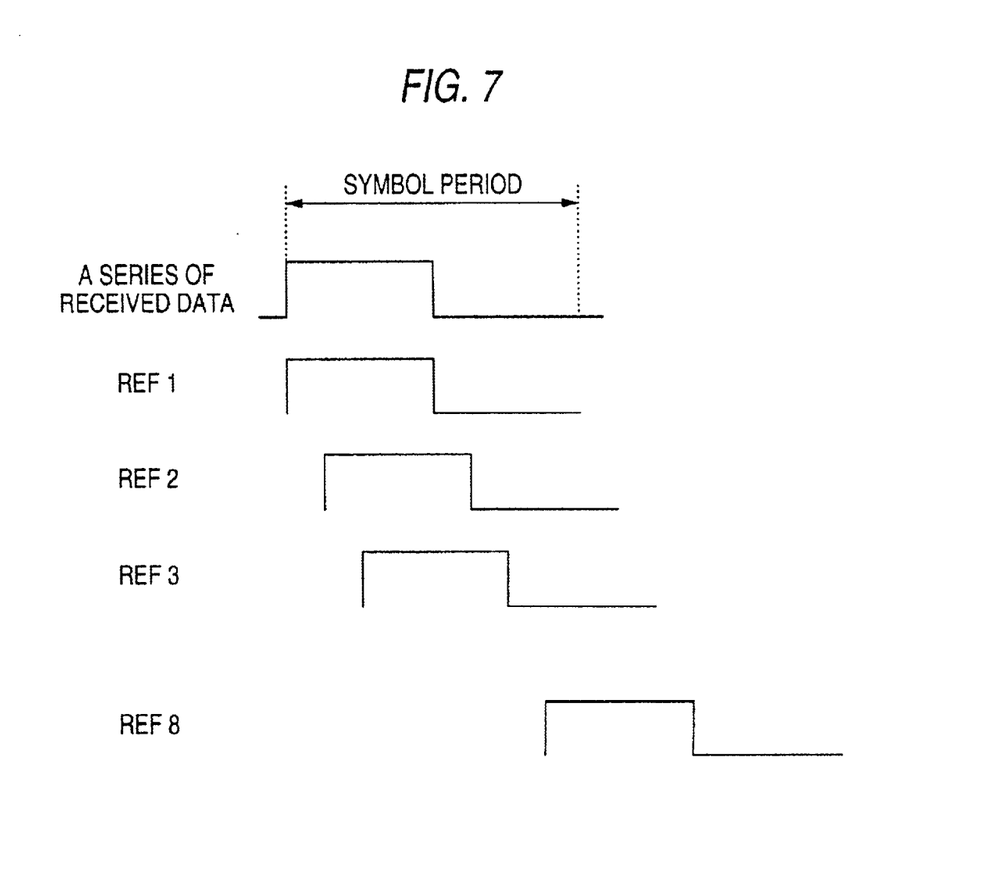
Figure 8:
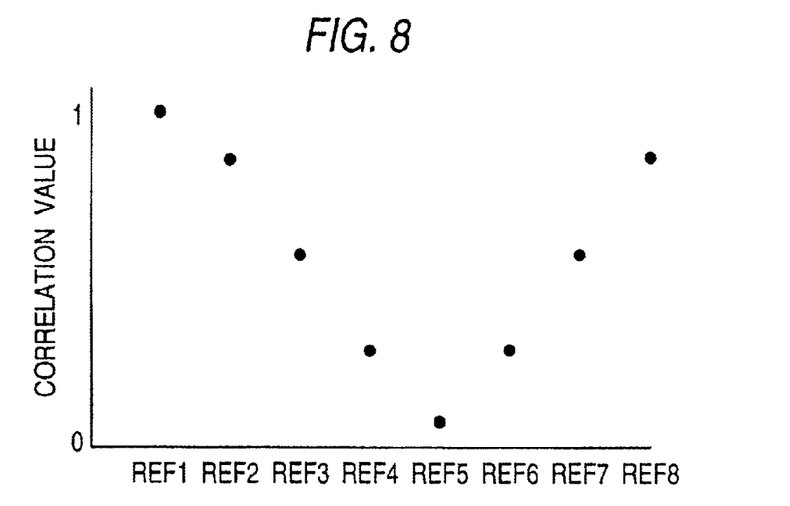
Figure 9:
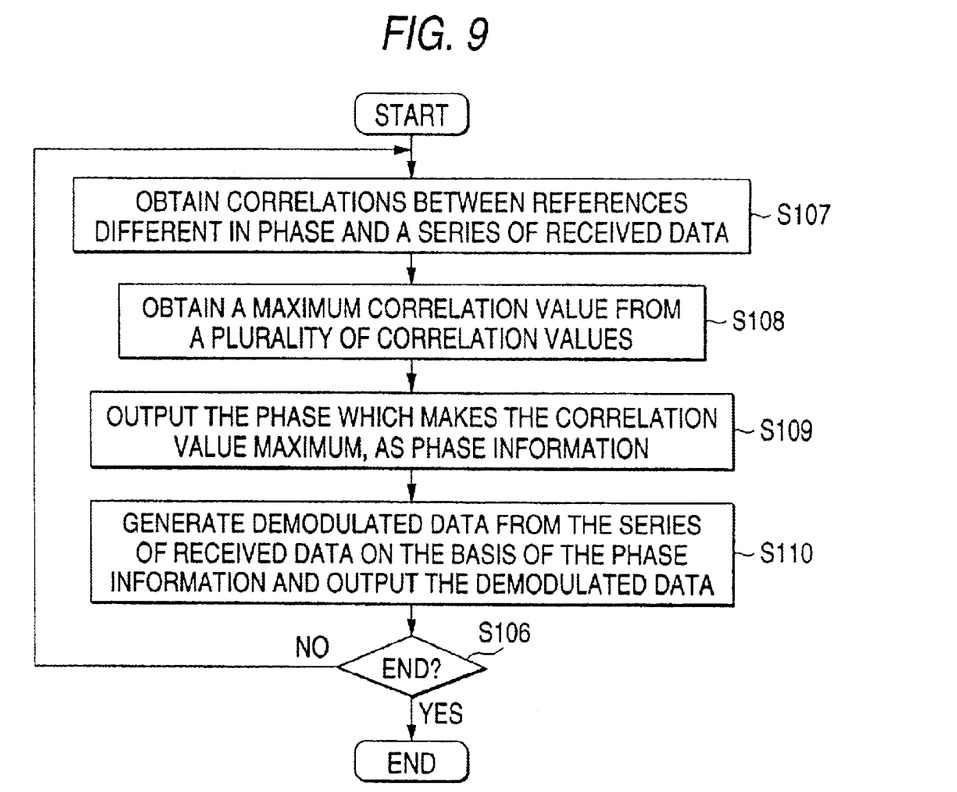

FIG. 6 is a block diagram showing a configuration of a demodulator in Embodiment 2 according to the present invention. FIG. 7 is a schematic diagram showing the operation principle of the demodulator shown in FIG. 6. FIG. 8 is an output characteristic diagram showing an output example of a correlator. FIG. 9 is a flow chart showing the operation of the demodulator shown in FIG. 6.

In FIG. 6, reference numeral 6 represents a correlator for obtaining correlation values between a series of received data and a plurality of references different in phase, and outputting the plurality of correlation values corresponding to the references; 7, a timing estimation circuit for detecting a maximum correlation value of the plurality of correlation values supplied from the correlator 6, and outputting the phase number of the maximum correlation value as phase information; and 8, a decimation circuit for decimating data from the series of received data by use of the phase information supplied from the timing estimation circuit 7, and outputting the decimated data as demodulated data. An input terminal 1 and an output terminal 5 are the same as those described in Embodiment 1.

First, the operation principle will be described with reference to FIGS. 6 to 9. Although correlations between a series of received data and references are obtained in the correlator 6 in the same manner as in the above Embodiment 1, a plurality of references different in the initial phases are used as the references of the correlator 6 in this Embodiment 2.

Assume that the number of samples per symbol is 8 and correlation values are within a range of −1 to 1 in order to simplify the description. However, the number of samples and the range of the correlation values may be set desirably (increased or reduced) in accordance with the system.

In the case of such a demodulator, 8 references different in phase are prepared as shown in FIG. 7. In the example of FIG. 7, references for "1" ("10" in Manchester code) are shown as an NRZ signal.

When a series of input data are inputted to the input terminal 1, the operation starts. Correlations between the series of received data and 8 references different in the initial phases as shown in FIG. 7 are obtained in the correlator 6 (Step S107). FIG. 8 shows an output example of correlation values, for example, when all the series of received data are "1". FIG. 8 shows correlation values between the series of received data and the references for "1".

When these 8 correlation values are compared, the correlation value becomes maximum when the phase of the reference is synchronous with the phase of the symbol, as shown in FIG. 8. Therefore, a correlation value taking a maximum value is obtained from the 8 correlation values in the timing estimation circuit 7 (Step S108), and the phase number of the reference making the correlation value maximum is supplied to the decimation circuit 8 as phase information (Step S109).

In the decimation-circuit 8, data corresponding to an optimum phase are decimated from the series of received data on the basis of the phase information supplied from the timing estimation circuit 7, and then outputted as demodulated data (Step S110). When the input of the series of received data disappears and the demodulation is completed, the operation is ended.

As described above, in the demodulator in this Embodiment 2, by use of a correlator, correlations between a series of received data and a plurality of references different in the initial phases are obtained, and an optimum data decision point of the series of received data is obtained. Accordingly, it is possible to perform modulation at a lower bit error rate.

Although the phase of a reference making a correlation value maximum is supplied as phase information to the decimation circuit 8 connected to the succeeding stage in the timing estimation circuit 7 in this Embodiment 2, the phase of a reference making a correlation value minimum may be regarded as a changing point of a symbol and supplied as phase information.

Although description has been made, in this Embodiment, about the case where a plurality of references different in the initial phases are used, the phase of a series of received data may be changed gradually, while one reference is used, so as to obtain a plurality of correlation values.

Although description has been made about the demodulator for a series of Manchester-coded received data, any coding may be adopted so long as each symbol is expressed by a plurality of bits on a time base. In the same manner as in the above Embodiment 1, for example, this Embodiment 2 is easily applicable to a demodulator for a series of received data coded by FM coding, MFM coding, or the like.

Embodiment 3

Although a reference for "1", or "0" is used as reference of a correlator in the above Embodiment 2, this reference may be subjected to adaptive processing in accordance with the state of a series of received data in the same manner as in the above Embodiment 1. In such a case, a state estimation circuit is added in the same manner as in the above Embodiment 1. FIG. 13 illustrates the configuration of the demodulator of Embodiment 2 with the inclusion of a state estimator.

The operation will be described. First, the state estimation circuit estimates a reception state such as waveform distortion or the like from a series of received data, and outputs waveform information based on the result of the estimation. The correlator corrects the form of references or sample points on the basis of the waveform information supplied from the state estimation circuit. Then, as described in the above Embodiment 2, correlations between the series of received data and the references are obtained, and an optimum data decision point of the series of received data is obtained to perform demodulation.

As described above, in the demodulator in this Embodiment 3, a reception state such as waveform distortion or the like is estimated by use of the waveform of a series of received data, and sample points or references of the correlator are corrected on the basis of the state. Accordingly, it is possible to perform modulation at a lower bit error rate even if the received waveform is distorted by intersymbol interference or detector characteristics.

Further, in the same manner as in the above Embodiment 2, any coding may be adopted so long as each symbol is expressed by a plurality of bits on a time base. For example, this Embodiment 3 is easily applicable to a demodulator for a series of received data coded by FM coding, MFM coding, or the like, as well as a series of Manchester-coded received data.

Embodiment 4

Although description has been made, in the above Embodiment 2, about a demodulator in which an optimum data decision point is obtained from a series of received data by use of a correlator so as to demodulate Manchester-coded signals, a clock recovery circuit may be constituted by use of only a function for obtaining an optimum data decision point.

That is, the clock recovery circuit in this Embodiment 4 according to the present invention is constituted by a correlator for gradually changing the phase of a series of Manchester-coded received data or a reference to thereby obtain a plurality of correlation values between the series of received data and the reference in accordance with the change of the phase; and a timing estimation circuit for detecting an optimum phase on the basis of the plurality of correlation values, and producing a recovered clock.

The correlator changes the phase of the series of received data or the reference gradually to thereby obtain a plurality of correlation values between the series of received data and the reference in accordance with the change of the phase. The timing estimation circuit detects an optimum phase on the basis of the plurality of correlation values to thereby generate an optimum recovered clock.

As described above, the clock recovery circuit in this Embodiment 4 obtain correlations between a series of received data and a reference while changing the phase of the series of received data or the reference gradually, detects an optimum phase on the basis of a plurality of correlation values, and generates an optimum recovered clock. Accordingly, it is possible to generate a more precise recovered clock.

Further, for example, when this clock recovery circuit is applied to a demodulator as shown in the above Embodiment 1, a more precise recovered clock can be generated, so that it is possible to perform demodulation at a further lower bit error rate.

Further, when a correlator is used in common, it is possible to improve the hardware efficiency.

Further, in the same manner as in the above Embodiment 2, any coding may be adopted so long as each symbol is expressed by a plurality of bits on a time base. For example, this Embodiment 4 is easily applicable to a demodulator for a series of received data coded by FM coding, MFM coding, or the like, as well as a series of Manchester-coded received data.

As described above, in the demodulator according to an aspect of the invention, a reference and/or sample points are corrected on the basis of waveform information based on a recovered clock and the result of estimation of a reception state such as waveform distortion or the like, and a correlation value between a series of received data and the reference is obtained from a plurality of sample points. Demodulated data is then outputted on the basis of the correlation value so as to be demodulated. Accordingly, it is possible to perform demodulation at a lower bit error rate when there is noise or interference, when a reception waveform is distorted by intersymbol interference or detector characteristic, or when the duty ratio is deteriorated.

Further, in the demodulator according to another aspect of the invention, correlations between a series of received data and a reference are obtained while the phase of the series of received data or the reference is changed gradually, a phase to be used for data decision is obtained on the basis of a plurality of correlation values, and the phase is used for demodulation. Accordingly, it is possible to perform demodulation at a lower bit error rate.

Further, in the demodulator according to a further aspect of the invention, correlations between a series of received data and a plurality of references different in the initial phases are obtained, a phase to be used for data decision is obtained on the basis of the plurality of correlation values correspondingly to the plurality of references, and the phase is used for demodulation. Accordingly, it is possible to perform demodulation at a lower bit error rate.

Further, in the demodulator according to a still further aspect of the invention, correlations between a reference having a predetermined phase and a series of received data the phase of which is changed gradually are obtained, a phase to be used for data decision is obtained on the basis of the plurality of correlation values in accordance with the change of the phase of the series of received data, and the phase is used for demodulation. Accordingly, it is possible to perform demodulation at a lower bit error rate.

Further, in the demodulator according to another aspect of the invention, a reception state such as waveform distortion or the like is estimated from a series of received data, and a reference and/or sample points are corrected on the basis of waveform information based on the result of the estimation. Accordingly, it is possible to perform demodulation at a lower bit error rate even if a received waveform is distorted by intersymbol interference or detector characteristics.

Further, in the clock recovery circuit according to an aspect of the invention, correlations between a series of received data and a reference are obtained while the phase of the series of received data or the reference is changed gradually, and a recovered clock is generated on the basis of a plurality of correlation values. Accordingly, it is possible to generate a more precise recovered clock. Further, when the clock recovery circuit is applied to a demodulator, it is possible to perform demodulation at a lower bit error rate.

Further, in the clock recovery circuit according to another aspect of the invention, correlations between a series of received data and a plurality of references different in the initial phases are obtained, and a recovered clock is generated on the basis of a plurality of correlation values in accordance with the plurality of references. Accordingly, it is possible to generate a more precise recovered clock. Further, when the clock recovery circuit is applied to a demodulator, it is possible to perform demodulation at a lower bit error rate.

Further, in the clock recovery circuit according to a further aspect of the invention, correlations between a reference having a predetermined phase and a series of received data the phase of which is changed gradually are obtained, and a recovered clock is generated on the basis of a plurality of correlation values in accordance with the change of the phase of the series of received data. Accordingly, it is possible to generate a more precise recovered clock. Further, when the clock recovery circuit is applied to a demodulator, it is possible to perform demodulation at a lower bit error rate.

Further, in the demodulation method according to another aspect of the invention, a reference and/or sample points are corrected on the basis of waveform information based on a recovered clock and the result of estimation of a reception state such as waveform distortion or the like, and a correlation value between a series of received data and the reference is obtained from a plurality of sample points. Demodulated data is then outputted on the basis of the correlation value so as to be demodulated. Accordingly, it is possible to perform demodulation at a lower bit error rate when there is noise or interference, when a reception waveform is distorted by intersymbol interference or detector characteristic, or when the duty ratio is deteriorated.

Further, in the demodulation method according to a further aspect of the invention, correlations between a series of received data and a reference are obtained while the phase of the series of received data or the reference is changed gradually, and a phase to be used for data decision is obtained and used for performing demodulation on the basis of a plurality of correlation values. Accordingly, it is possible to perform demodulation at a lower bit error rate.

Further, in the demodulation method according to a still further aspect of the invention, a reception state such as waveform distortion or the like is estimated from a series of received data, and a reference and/or sample points are corrected on the basis of waveform information based on the result of the estimation. Accordingly, it is possible to perform demodulation at a lower bit error rate even in the case where a received waveform is distorted by intersymbol interference or detector characteristics.

Further, in the clock recovery method according to an aspect of the invention, correlations between a series of received data and a reference are obtained while the phase of the series of received data or the reference is changed gradually, and a recovered clock is generated on the basis of a plurality of correlation values. Accordingly, it is possible to generate a more precise recovered clock. Further, when this method is applied to a demodulator, it is possible to perform demodulation at a lower bit error rate.

What is claimed is:

1. A demodulator for generating demodulated data from a series of received data which is coded so that each symbol is expressed by a plurality of bits on a time base, said demodulator comprising:

a clock recovery circuit for generating a recovered clock from said series of received data and outputting said recovered clock;

a state estimation circuit for making an estimation about a reception state from said series of received data, and outputting waveform information based on the result of said estimation; and a correlator for correcting a reference and/or sample points on the basis of said recovered clock and said waveform information, obtaining a correlation value between said series of received data and said reference from a plurality of said sample points, and outputting demodulated data on the basis of said correlation value.

2. A demodulator according to claim 1, wherein said estimation about a reception state is determined, at least in part, based on the quality of a channel for receiving said series of received data.

3. A demodulator according to claim 1, wherein said estimation about a reception state is determined, at least in part, based on waveform distortion determined from said series of received data.

4. A demodulator according to claim 3, wherein said determined waveform distortion includes jitters in sign-change points or deviations in the duty ratio of the waveform.

5. A demodulator according to claim 1, wherein said correlator corrects sample points by determining a subset of one or more of said sample points not to be used to determine said correlation value.

6. A demodulator according to claim 1, wherein said reception state includes waveform distortion.

7. A demodulator for generating demodulated data from a series of received data which is coded so that each symbol is expressed by a plurality of bits on a time base, said demodulator comprising:

a correlator for changing the phase of said series of received data or a reference gradually to thereby obtain correlations between said series of received data and said reference, and outputting a plurality of correlation values;

a timing estimation circuit for obtaining a phase to be used for decision of said data on the basis of said plurality of correlation values, and outputting said phase as phase information; and a decimation circuit for decimating data from said series of received data on the basis of said phase information, and outputting said decimated data as demodulated data.

8. A demodulator according to claim 7, wherein said correlator obtains correlations between said series of received data and a plurality of references the initial phases of which are different from one another, and outputs a plurality of correlation values corresponding to said plurality of references.

9. A demodulator according to claim 7, wherein said correlator obtains correlations between a reference having a predetermined phase and said series of received data the phase of which is changed gradually, and outputs a plurality of correlation values in accordance with the change of the phase of said series of received data.

10. A demodulator according to claim 7, further comprising a state estimation circuit for making an estimation about a reception from said series of received data, and outputting waveform information based on the result of said estimation, and said correlator corrects said reference and/or sample points on the basis of said waveform information.

11. A demodulator according to claim 10, wherein said reception state includes waveform distortion.

12. A clock recovery circuit for recovering a clock from a series of received data which is coded so that each symbol is expressed by a plurality of bits on a time base, said clock recovery circuit comprising:

a correlator for gradually changing the phase of said series of received data or a reference to obtain correlations between said series of received data and said reference and outputting a plurality of correlation values; and a state estimation circuit for outputting waveform information that instructs the correlator as to which of the plurality of bits are utilized in obtaining the correlations between said series of received data and said reference, wherein a recovered clock is obtained on the basis of a minimum of said plurality of correlation values.

13. A clock recovery circuit according to claim 12, wherein said correlator obtains correlations between said series of received data and a plurality of references the initial phases of which are different from one another, and outputs a plurality of correlation values corresponding to said plurality of references.

14. A clock recovery circuit according to claim 12, wherein said correlator obtains correlations between a reference having a predetermined phase and said series of received data the phase of which is changed gradually, and outputs a plurality of correlation values in accordance with the change of the phase of said series of received data.

15. A demodulation method for generating demodulated data from a series of received data which is coded so that each symbol is expressed by a plurality of bits on a time base, said method comprising the steps of:

as a clock recovery step, generating a recovered clock from said series of received data and outputting the recovered clock; a state estimation step of making an estimation about a reception state such as waveform distortion from said series of received data, and outputting waveform information based on the result of said estimation; and as a correlation step, correcting a reference and/or sample points on the basis of said recovered clock and said waveform information, obtaining a correlation value between said series of received data and said reference from a plurality of said sample points, and outputting demodulated data on the basis of said correlation value.

16. A demodulation method for generating demodulated data from a series of received data which is coded so that each symbol is expressed by a plurality of bits on a time base, said method comprising the steps of:

as a correlation step, changing the phase of said series of received data or a reference gradually to obtain correlations between said series of received data and said reference, and outputting a plurality of correlation values;

as a timing estimation step, obtaining a phase to be used for data decision on the basis of said plurality of correlation values, and outputting said phase as phase information; and as a decimation step, decimating data from said series of received data on the basis of said phase information, and outputting said decimated data as demodulated data.

17. A demodulation method according to claim 16, further comprising a state estimation step of making an estimation about a reception state from said series of received data, and outputting waveform information based on the result of said estimation, and said correlation step corrects said reference on the basis of said waveform information.

18. A demodulator according to claim 17, wherein said reception state includes waveform distortion.

19. A clock recovery method for recovering a clock from a series of received data which is coded so that each symbol is expressed by a plurality of bits on a time base, said method comprising the steps of:

as a correlation step, gradually changing the phase of said series of received data or a reference to obtain correlations between said series of received data and said reference to thereby output a plurality of correlation values; and outputting, from a state estimation circuit, waveform information that instructs correlator as to which of the plurality of bits are utilized in obtaining the correlations between said series of received data and said reference, wherein a recovered clock is obtained on the basis of a minimum of said plurality of correlation values.

20. A clock recovery circuit for recovering a clock from a series of received data which is coded so that each symbol is expressed by a plurality of bits on a time base, said clock recovery circuit comprising:

a correlator for gradually changing the phase of said series of received data to obtain correlations between said series of received data and a reference and outputting a plurality of correlation values; and a state estimation circuit for outputting waveform information that instructs the correlator as to which of the plurality of bits are utilized in obtaining the correlations between said series of received data and said reference, wherein a recovered clock is obtained on the basis of said plurality of correlation values.

21. A clock recovery method for recovering a clock from a series of received data which is coded so that each symbol is expressed by a plurality of bits on a time base, said method comprising the steps of:

changing the phase gradually of said series of received data to obtain correlations between said series of received data and said reference;

outputting a plurality of correlation values; and outputting, from a state estimation circuit, waveform information that instructs correlator as to which of the plurality of bits are utilized in obtaining the correlations between said series of received data and said reference, wherein a recovered clock is obtained on the basis of said plurality of correlation values.

* * * * *